(12) United States Patent
Yoda et al.

(10) Patent No.: US 7,067,830 B2
(45) Date of Patent: Jun. 27, 2006

(54) MULTI-ELECTRON BEAM EXPOSURE METHOD AND APPARATUS

(75) Inventors: Haruo Yoda, Nishitama (JP); Yasunari Souda, Kawasaki (JP); Hiroya Ohta, Kodaira (JP); Yoshikiyo Yui, Utsunomiya (JP); Shinichi Hashimoto, Tokyo (JP)

(73) Assignees: Hitachi, Ltd., Tokyo (JP); Canon Kabushiki Kaisha, Tokyo (JP); Advantest Corporation, Tokyo (JP)

( * ) Notice: Subject to any disclaimer, the term of this patent is extended or adjusted under 35 U.S.C. 154(b) by 191 days.

(21) Appl. No.: 10/629,623

(22) Filed: Jul. 30, 2003

(65) Prior Publication Data

US 2004/0143356 A1 Jul. 22, 2004

(30) Foreign Application Priority Data

Jul. 30, 2002 (JP) ........................... 2002-221229

(51) Int. Cl.
*H01J 37/08* (2006.01)

(52) U.S. Cl. .................................. 250/492.22
(58) Field of Classification Search ............ 250/492.22, 250/492.23, 398
See application file for complete search history.

(56) References Cited

U.S. PATENT DOCUMENTS 6,483,120 B1 * 11/2002 Yui et al. ................. 250/491.1
6,515,409 B1 * 2/2003 Muraki et al. ............ 313/359.1
6,787,784 B1 * 9/2004 Okunuki ................. 250/492.22

\* cited by examiner

*Primary Examiner*—Kiet T. Nguyen
(74) *Attorney, Agent, or Firm*—Antonelli, Terry, Stout & Kraus, LLP

(57) ABSTRACT

The dimension of the main field as a unit region for exposure is set to an integral submultiple of the arrangement pitch of the LSI to be exposed, by the control computer 62, and the exposure data stored in the form associated with electron beams from a data generation circuit 64 is limited to one-chip data alone in units of a stripe. This data is repeatedly read out to write the stripe. Further, a storage circuit 66 is provided to store the exposure data by means of a double buffer memory unit for each electron beam. While LSI is written according to one of the buffers, the next exposure stripe data is prepared on the other buffer, thereby bringing about a substantial reduction in the required speed of the exposure data generation circuit.

9 Claims, 9 Drawing Sheets

*FIG. 13a*      *FIG. 13b*
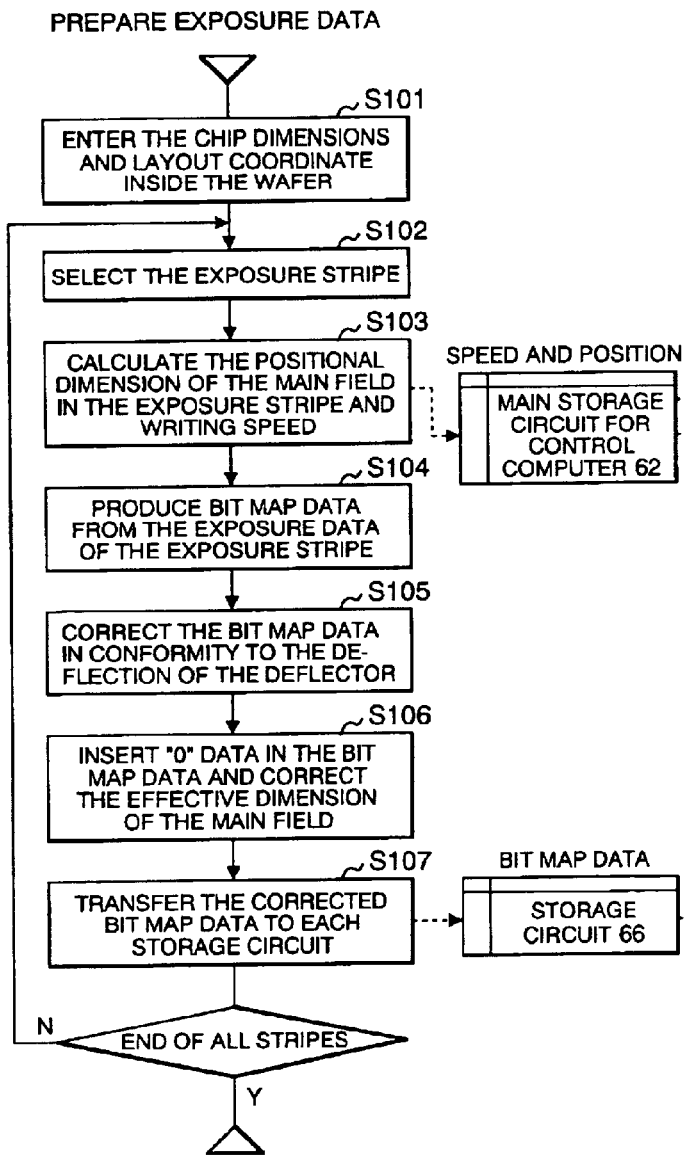
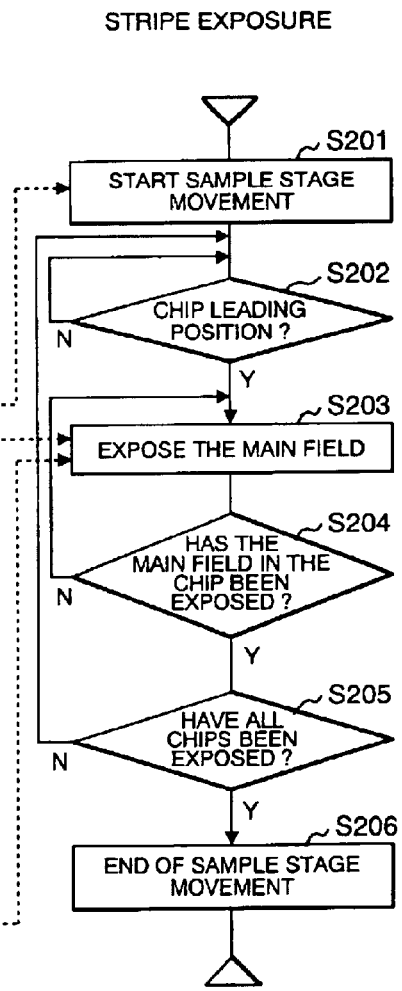

MULTI-ELECTRON BEAM EXPOSURE METHOD AND APPARATUS

BACKGROUND OF THE INVENTION

The present invention relates to electron beam lithography for writing a circuit pattern on a semiconductor substrate using electron beam, particularly to a multi-electron beam exposure method and apparatus using multiple electron beams.

Electron beam lithography for writing a circuit pattern directly on a semiconductor substrate using electron beam s is anticipated to make a great contribution as a next-generation writing art for a medium-to-low volume production of a wide variety of products because this art is capable of writing a submicron semiconductor circuit pattern and does not require use of a high-priced pattern projection mask.

However, a substantial improvement in the writing speed is essential for commercial widespread use of the art of writing by electron beam. In recent years, high-speed multi-electron beam exposure methods based on multiple electron beam s have come to be proposed for the improvement in writing speed.

For example, the Japanese Laid-Open Patent Publication No. 2000-243337 discloses a multi-electron beam exposure method wherein multiple electron beams formed by an aperture array are deflected by a common main deflector and sub-deflector, and a desired pattern is exposed on a sample. Other method of forming multiple electron beams includes a great variety of arts such as the method for arranging multiple electron sources and the method for combining multiple electron sources and aperture arrays.

Many of these proposed methods, however, may produce two-dimensionally arranged spot beams because of its simple configuration, and the writing methods are practically the same. Referring to the aforementioned Japanese Application Patent Laid-Open Publication No. 2000-243337, the following describes a specific writing method when multiple electron beams are produced in a 64×64-beam array of a 4-µm pitch.

Multiple electron beams arranged are collectively deflected by a common sub-deflector and are each raster-scanned within the scope of 4 µm square.

This allows a 4 µm square region to be exposed to each electron beam. So the 256 µm square tetragonal regions (sub-field) can be exposed in parallel as a whole. Upon termination of the exposure on 256 µm square region as one of these regions, all the electron beams are moved 256 µm collectively in the X-axis direction (horizontally) by the main deflector in such a way that the 256-µm region can be exposed again by the sub-deflector.

If this operation is continued within the range where deflection can be achieved by the main deflector, exposure is applied to the oblong region (main field) having a width that can be deflected by the main deflector. Thus, if this main field exposure operation is repeated while the sample stage is moved in the Y-axis direction (longitudinal direction), then it is possible to expose the slender stripe region having a main deflection width.

Exposure of all the surfaces of a sample requires all sample surfaces to be partitioned into stripes, then writing of stripes should be performed while the sample stage is moved in the X-axis direction. This method enables parallel writing of 4096 electron beams, and therefore ensures higher writing speed than the prior art method, although each beam is a spot beam.

One of the problems in achieving the aforementioned exposure method is the pattern data generation method for controlling irradiation of each electron beam in conformity to a predetermined writing speed. For example, if a pattern is resolved into 16 nm square pixel and a maximum of 10 ns exposure time is assigned to each pixel, it is necessary to generate data at a speed as high as 409.6 Giga-Bytes per second in order to keep up with the writing speed. This data speed is equivalent to 10,000 times that of the ordinary TV display. This speed can be achieved if the semiconductor circuit pattern is to be expanded in a bit map form in advance and stored in a high speed storage circuit, and is to be read out the time of writing.

However, this requires an extra-high speed storage circuit having a massive capacity of as much as 2400 Giga-Bytes that stores the pattern having a maximum of about 25 mm square. In other words, if the data is to be stored as bit map data in advance, it is necessary to provide a high speed storage circuit having a massive capacity amounting to much as 2400 Giga-Bytes.

When the CAD data of excellent compression rate is to be stored and real-time expansion into the bit map data is to be performed at the time of writing, it is necessary to install a data expansion device having a speed 10,000 times that of the ordinary TV display.

The Japanese Laid-Open Patent Publication No. Hei 07-273006 discloses a configuration wherein bit map data is generated in advance and is stored in multiple large-capacity disks. Further, the Japanese Application Patent Laid-Open Publication No. 2001-76989 discloses a configuration where dot control data is generated at a high speed by multiple expansion sections. However, these proposals fail to prevent the size of the equipment from being increased due to the aforementioned reasons.

SUMMARY OF THE INVENTION

The object of the present invention is to avoid the problems with systematization in such a multi-beam approach, and to provide a multi-electron beam exposure method and apparatus that can be realized by bit map data generation means of practical level.

The majority of subjects to be written by an electron beam exposure method according to the present invention are semiconductor circuit patterns written on a semiconductor wafers. In the case of a semiconductor circuit pattern, many LSI chips of the same type are normally arranged in a lattice and then writing is performed.

As described above, when a sample stage is moved at a uniform speed for repeated exposure of the same stripe regions, the same stripe regions of the LSI chips of the same type will be subjected to repeated exposure.

The present invention has been made with consideration given to such characteristics of the subjects to be exposed. The basic concept is to build up an arrangement wherein multiple electron beams each share the responsibility for repeated exposure of the same subregions of the LSI chip patterns of the same type. This arrangement allows each electron beam control circuit to retain only the data of the specific subregion on one LSI chip. This permits a pattern to be written by repeated reading of such data the number of times equivalent to the number of chips.

In other words, if there are ten LSI chips on one stripe, repeated reading of data ten times is sufficient for this purpose. Further, if there are arrays of the same chips in the horizontal direction of the LSI wafer as well, collective writing of the corresponding stripes of the same pattern permits repeated reading by the number of times equivalent to the number of stripes.

So the storage circuit to store data for each electron beam is used as a double buffer memory unit. Means are provided to ensure that, while the data stored in one of the buffers is read out repeatedly, the next stripe pattern data is expanded and stored in the other buffer. This arrangement reduces the pattern expanding speed to one tenth through a few millionths of the writing speed.

Further, if the stripe width is about 1 mm, the storage capacity required for the double buffer memory unit can be as small as $1/12.5$ for a 25 mm-square LSI chip, this amount being smaller by one digit or more. The amount of beam to be stored for each electron beam can be obtained from dividing this capacity by the number of electron beams. It is also possible to arrange such a configuration that electron beams are partitioned into groups without a double buffer memory unit for each beam, and a double buffer memory unit is provided for each group.

The aforementioned arrangement allows a reduced storage circuit capacity and a longer pattern data preparation time. It permits data pattern generation means to be achieved on a practical level, and enables a commercial use of a multi-electron beam exposure apparatus.

In the multi-electron beam exposure apparatus, however, the exposure region per unit by sub-deflector scanning is fixed at 256 μm square. This makes it generally difficult to provide repeated exposure of the same regions of a pattern to the same electron beams. To avoid this problem, the following describes a control method that permits exposure of the same subregions of an LSI chip to each electron beam.

According to the present invention, when a sample surface is represented in an X-Y coordinate system and the continuous traveling direction of a sample stage is assumed as a Y-axis direction, the exposure region on the sample surface is partitioned into multiple stripe regions having a width in the X-axis direction, and each of these stripe regions is further partitioned into multiple main fields having a width in the Y-axis direction. When each main field is exposed to multiple electron beams, the width of each main field in the Y-axis direction is set to an integral submultiple of the repeated pitch of the LSI pattern to be exposed in the Y-axis direction.

This arrangement allows the main field in the Y-axis direction in each LSI chip to be kept at one and the same position at all times, and permits each electron beam to be repeatedly applied to the same subregion (exposure unit region=chip stripe area) of the LSI chip, thereby realizing complete characteristics of the present invention.

According to another way of permitting the same subregion of the LSI chip to be exposed to each electron beam, exposure is performed by partitioning the region into the main fields having a fixed dimension from the exposure startup position for each LSI chip, and, at the terminal portion of the LSI chip, the residual area subsequent to partitioning is written as narrow main field regions.

This alternative method also allows the present invention to be embodied. When this method is used, however, the main field exposure time is constant without depending on the width of the main field in the Y-axis direction in the assumed multi-electron beam exposure method. This induces a change in the writing speed in the Y-axis direction, with the result that writing accuracy deteriorates as compared with the case where the width of the main field is set to an integral submultiple of the repeated pitch in the Y-axis direction.

Further, the width of each stripe in the X-axis direction is also set to an integral submultiple of the repeated pitch of the chip pattern to be exposed in the X-axis direction, according to the present invention.

This arrangement allows the main field in the X-axis direction in each LSI chip to be kept at one and the same position at all times, and permits each electron beam to be repeatedly applied to the same subregion of the LSI chips laid out in the X-axis direction. In other words, the object of the present invention can be achieved by providing means for ensuring adequate setting of the main field width, depending on the pattern to be written.

To set the width of the main field to a desired value as described above, it is necessary to disable all or some of the sub-fields constituting the main field to be exposed. In other words, the exposure pattern data in the sub-field lying off the width of the main field is forcefully set to zero (0), or the portion lying off the width of the main field is masked.

When the LSI chip to be written is small, multiple chips are regarded as one chip, to which the present invention can be applied. For small chips, reduction in the width of the main field may result in a reduced writing speed, but the possibility of reduced writing speed can be minimized when multiple small chips are handled as one large chip.

According to the present invention, the bit map data can be written by the same electron beam at the same amounts of main and sub-deflections at all times. Thus, if the bit map data to be issued is distorted in advance so as to correct the main and sub-deflection, a pattern without deflection can be written.

Further, when electron beam is used for writing, the bit map data may be adjusted in order to correct the adverse effect caused by forward scattering of electron beam and thermal deformation of a sensitizer. This allows such bit map data adjustment to be corrected in the phase of data generation. The speed for bit map data generation and storage may be kept at one tenth through one hundredth the speed for reading and writing the data. So the size of the required circuit can be reduced to one tenth through one hundredth that in the case where the bit map data is corrected for each writing operation.

In the aforementioned description, all the chips on the wafer are assumed to have one and the same pattern for easy of explanation. For chips of different patterns, the effect of the present invention can be achieved by memorizing the bit map data items to be written in the same number as that of the chip types, if the chip dimension in the Y-axis direction is the same. Normally, the present invention can be easily achieved by collecting the same patterns for each Y-axis direction on the wafer.

BRIEF DESCRIPTION OF THE DRAWINGS

FIG. 13 is a flowchart representing the procedure for multi-electron beam exposure method as one and embodiment;

DETAILED DESCRIPTION OF THE PREFERRED EMBODIMENTS

Figure 2:
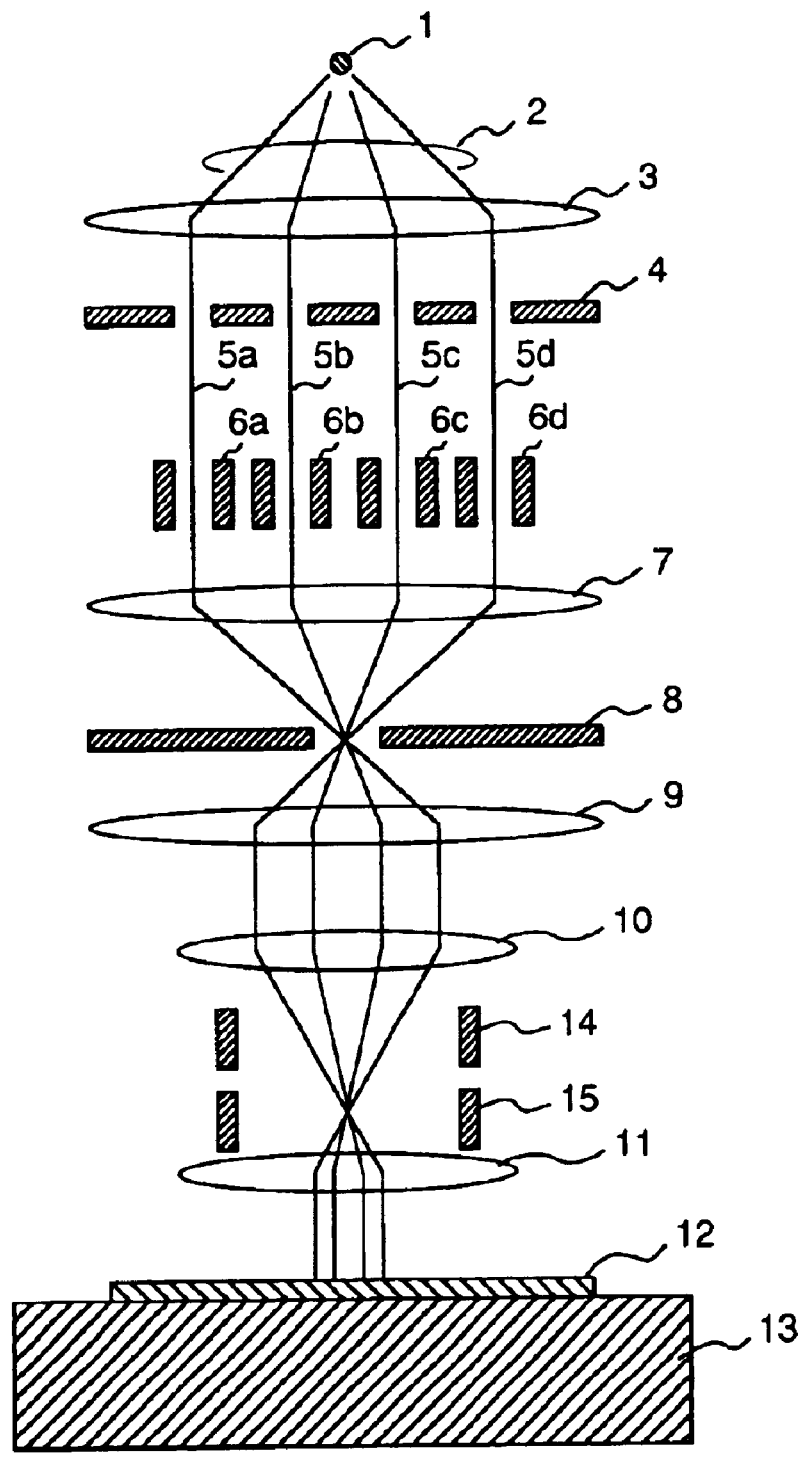
FIG. 2 is an explanatory diagram showing a multiple spot beam exposition method.

Referring to the drawings, the following describes the details of the preferred embodiments of the present invention: FIG. 2 shows an electron beam column for forming multiple spot beams. Electron beam 2 emitted from an electron gun 1 are corrected into parallel electron beams by an electron lens 3, and are partitioned into multiple electron beams 5a, 5b, 5c and 5d by an aperture array 4. The partitioned electron beams each pass through individual blanking deflectors 6a, 6b, 6c and 6d, and are converged by an electron lens 7 to pass through a blanking aperture 8.

Further, they are reduced by electron lens 9, 10 and 11, and are projected on the semiconductor 12 of a sample stage 13 as multiple spot beams. A main deflector 14 and sub-deflector 15 deflect the orbit of electron beam, thereby ensuring that the position exposed to electron beam on the semiconductor wafer 12 can be changed to any desired position within the range of deflection.

The time for each electron beam to be applied to the wafer is controlled by the blanking deflectors 6a, 6b, 6c and 6d and blanking aperture 8. For example, when voltage is applied to the blanking deflector 6a to deflect the electron beam 5a, then the deflected electron beam 5a cannot pass through the blanking aperture 8 and the surface on the wafer cannot be exposed to the beam. This arrangement permits multiple spot beams to be formed. These spot beams are applied to a desired position on the wafer for a desired period of time, thereby permitting a desired pattern to be written thereon.

Figure 3:
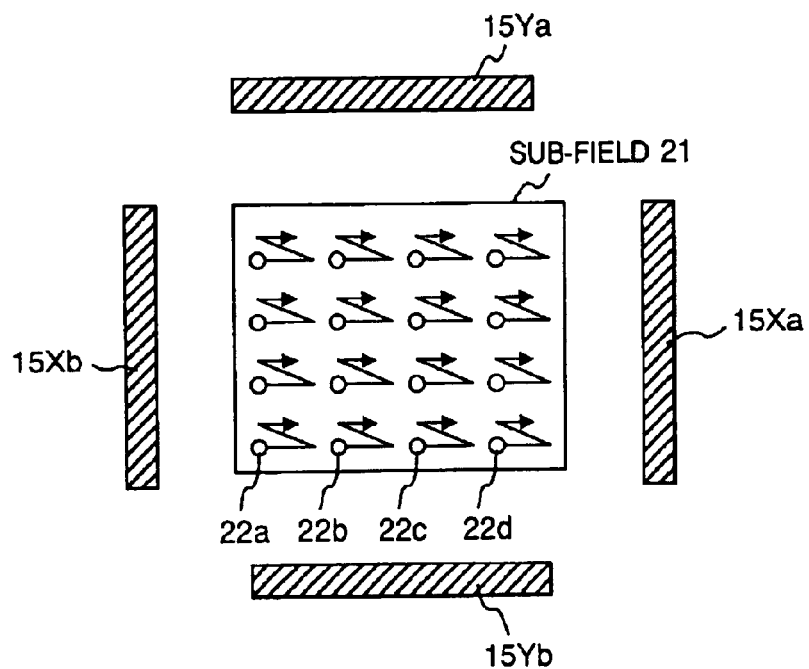
FIG. 3 is an explanatory diagram representing the method of using multiple electron beams to write a sub-field.

FIG. 3 is an explanatory diagram representing the method of using a sub-deflector to write the interior of the sub-field. Four-by-four spot beams 22a, 22b, 22c, etc. formed by the aforementioned arrangement start raster scanning on the wafer simultaneously upon application of voltage to the sub-deflectors 15Xa, 15Xb, 15Ya and 15Yb.

If each electron beam has a pitch of 4 μm, it can solidly fill each of 4 μm square subregions (called μ fields). In this case, if the blanking deflector 6 of each electron beam is driven by the pattern data having a bit map format corresponding each region, the entire sub-field 21 can be written as a whole.

Figure 4:
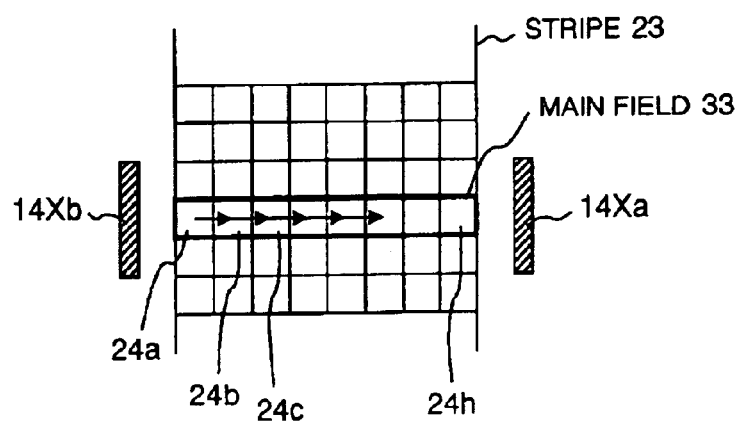
FIG. 4 is an explanatory diagram representing how sub-fields are moved to write a main field 33.

FIG. 4 is an explanatory diagram representing how sub-fields 24a, 24b, 24c, etc. are moved by main deflectors 14Xa and 14Xb according to the step-and-repeat method, whereby a main field 33 is written.

Repeated writing of such an oblong main field allows the sample to be moved downward continuously by a sample stage so that the entire stripe region can be written. In actual writing operation, electron beam is applied while the deflected position is moved in conformity to the movement of the sample stage. However, detailed description will be omitted since this is not directly connected to the major points of the present invention.

Figure 5:
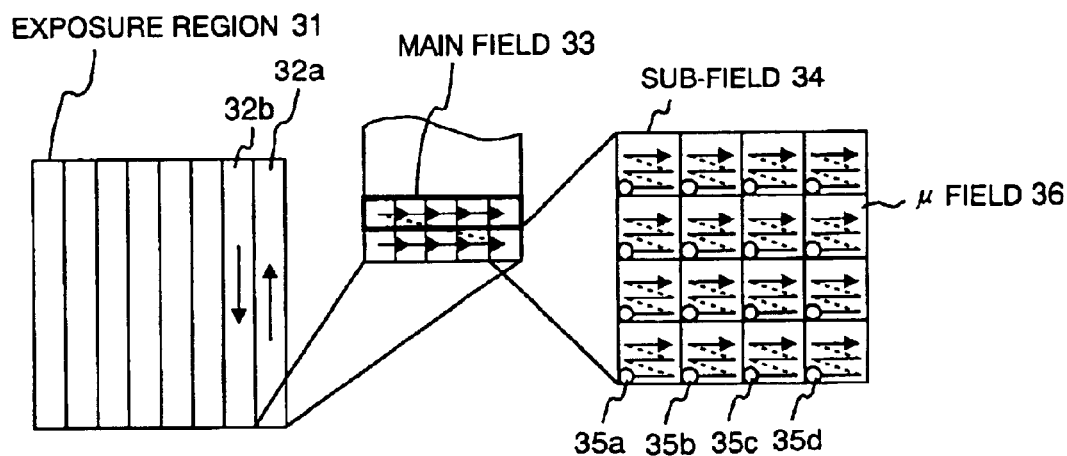
FIG. 5 is an explanatory diagram representing the procedure for writing all surfaces in the exposure range.

FIG. 5 is a drawing again showing the procedure for writing an exposure region on a sample. Exposure region 31 is partitioned into multiple stripe regions 32a, 32b, etc. The stripe regions can be written in the same direction at all times, or can be written alternately as shown in the drawing. Stripes each are written sequentially in the sample traveling direction wherein writing of an oblong main field 33 is handled as one unit. Main fields 33 are sequentially written in the horizontal direction with the sub-field as a unit. Further, each sub-field 34 is written by parallel writing of a fine subregion 36 by electron beams 35a, 35b, etc. This fine subregion 36 is called a μ field.

Figure 6:
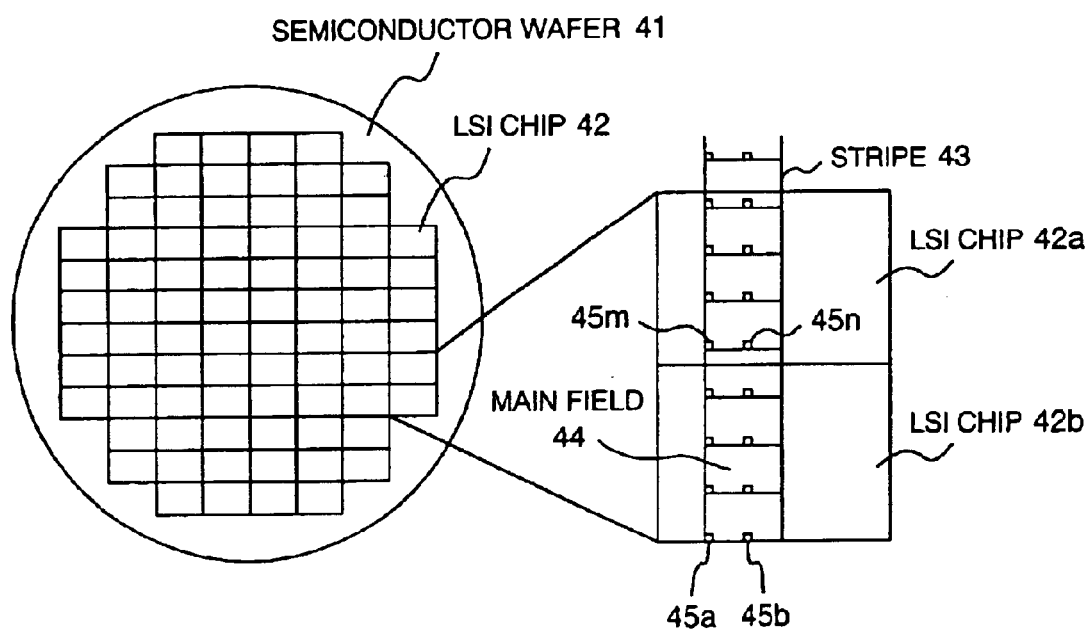
FIG. 6 is an explanatory diagram representing a case where the longitudinal width of the main field is fixed in advance and the relationship between it and the longitudinal width of a chip cannot be divided without remainder.

FIG. 6 shows how a semiconductor wafer 41 consisting of multiple LSI chips 42 is written according to the aforementioned method. When the LSI chips 42a and 42b are written as shown in the drawing, if one stripe 43 is partitioned into the main field 44 having a fixed longitudinal width and is written, then μ fields 45a, 45b, . . . 45m, 45n, etc. to be written by the same electron beam all require different pattern data, and the control circuit of each electron beam is required to store the pattern data of many μ fields.

Figure 7:
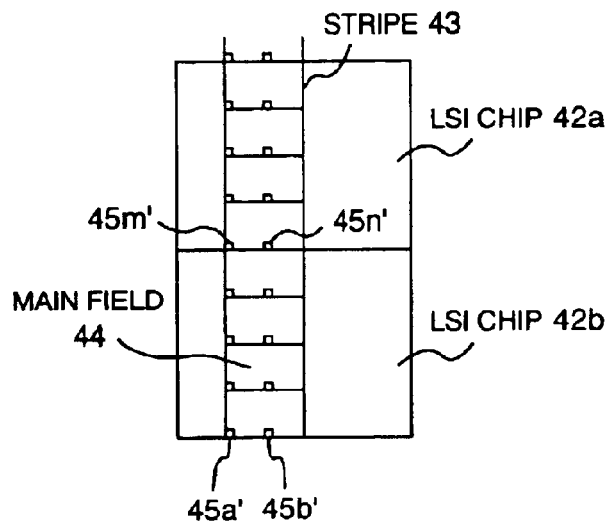
FIG. 7 is an explanatory diagram representing the case where the longitudinal width of the main field is set to an integral submultiple of the longitudinal width of the chip in the present invention.

FIG. 7 is an explanatory diagram showing how a semiconductor wafer 41 consisting of multiple LSI chips 42 according to the present invention is written. In the present invention, the longitudinal width of the main field is set to an integral submultiple of that of the LSI chip. In this case, the longitudinal width of the chip corresponds to the exposure unit region. The μ fields 45a' and 45m', and 45b' and 45n' to be written by the same electron beam are identically the same data, respectively. So when multiple chips are written, it is sufficient to store a limited number of μ field data items as in the case where a single LSI chip is written.

Figure 8:
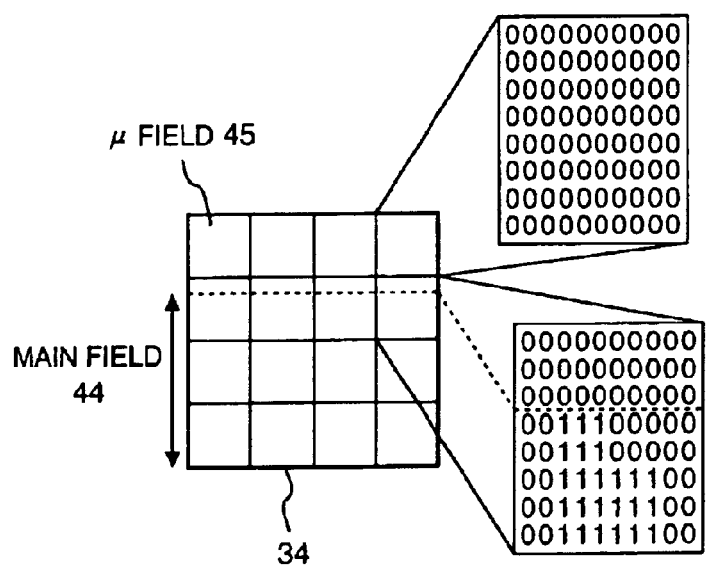
FIG. 8 is an explanatory diagram representing how to invalidate the sub-field region lying off the longitudinal width of the main field set at random.

FIG. 8 is a drawing representing an example where the longitudinal width of the main field is made variable. As illustrated, this is achieved when the exposure pattern data inside the sub-field lying off the longitudinal width of the main field is forcefully set to zero. Apart from the method of setting zero to the pattern, it is also possible to mask the region lying off the edge to remove it from the scope of exposure.

Figure 9:
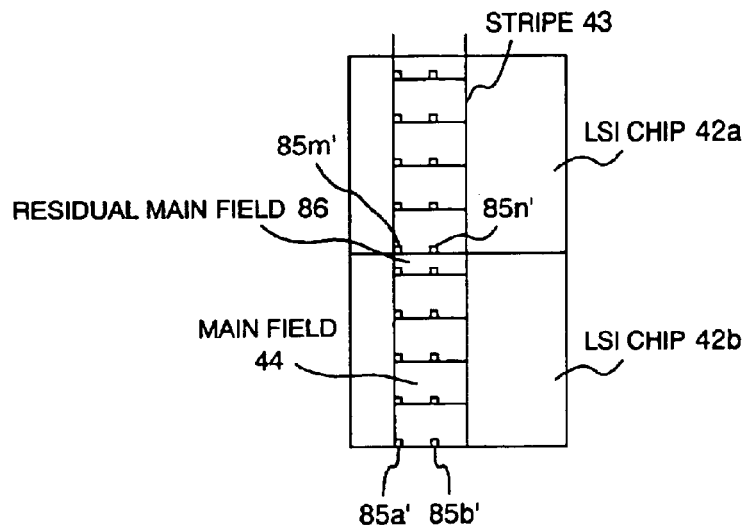
FIG. 9 is an explanatory diagram showing another method of the invention wherein a pattern is assigned to the remaining main fields that cannot be divided without remainder by the longitudinal width of the main field with the longitudinal width of the chip fixed.

FIG. 9 shows another method of the invention. When each electron beam is to write the same subregion, the region is partitioned into the main field having the maximum dimension from the exposure startup position for each of the LSI chips 42a and 42b, and, at the terminal portion of the LSI chip, the residual area subsequent to partitioning is written as narrow main field regions. After that, the μ fields 85a' and 85m', and 85b' and 85n' to be written by the same electron beam are identically the same data, respectively. So the same effect as that in the embodiment shown in FIG. 8 is obtained.

Figure 10:
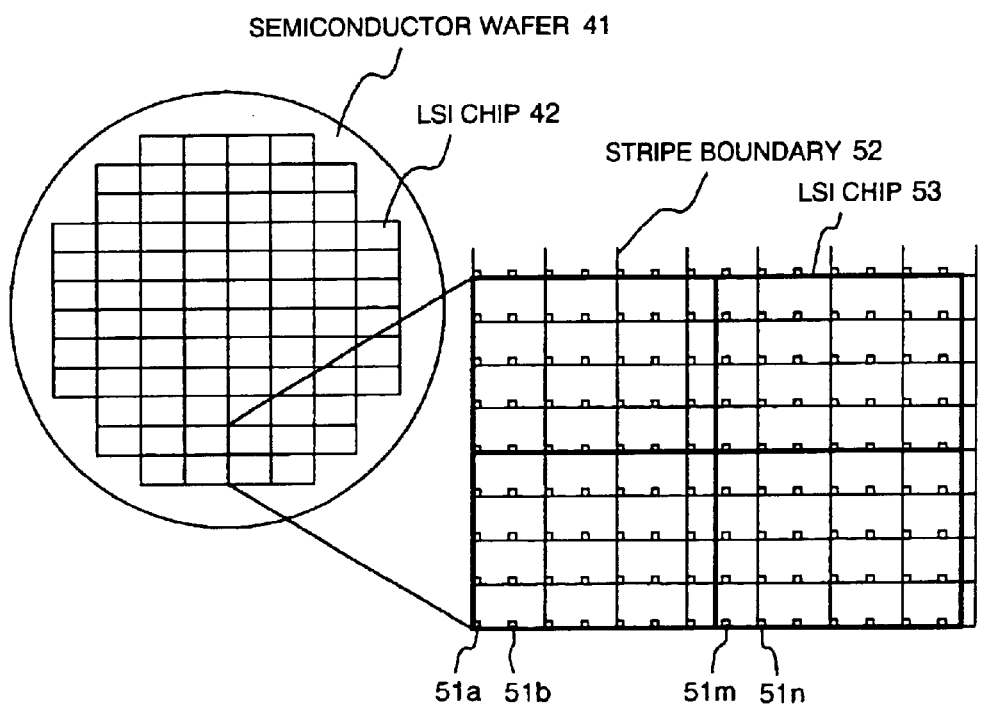
FIG. 10 is an explanatory diagram representing the case where the lateral width of the main field is fixed in advance and the relationship between it and lateral width of the chip cannot be divided without remainder.

This also applies to the lateral width of the stripe. FIG. 10 is an explanatory diagram representing the case of writing the LSI chips arranged in the lateral direction when the stripe width is fixed. A stripe boundary 52 and LSI chip 53 are shown in this drawing. In this case as well, μ fields 51a, 51b, 51m and 51n to be written by the same electron beam all require different exposure data, and the control circuit of each electron beam is required to store the pattern data of many μ fields.

Figure 11:
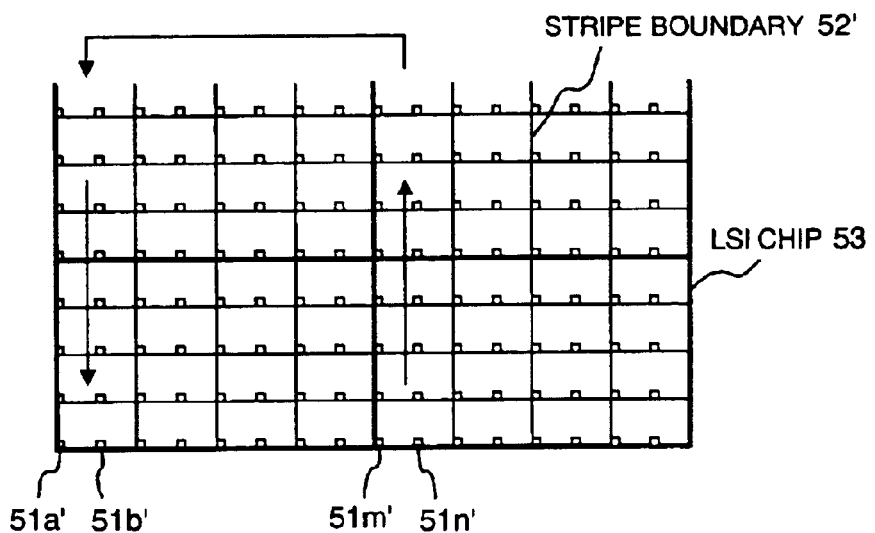
FIG. 11 is an explanatory diagram representing the case wherein the lateral width of the main field is set to an integral submultiple of the lateral width of the chip in the present invention.

FIG. 11 is an explanatory diagram according to the present invention. When the lateral width of the stripe is set to an integral submultiple of the lateral width of the LSI chip, μ fields 51a' and 51m', and 51b' and 51n' to be written by the same electron beam all are identically the same data, respectively. When LSI chips laid out in the horizontal direction are written, it is sufficient to store a limited number of μ field data items, as in the case where a single LSI chip is written.

Figure 12:
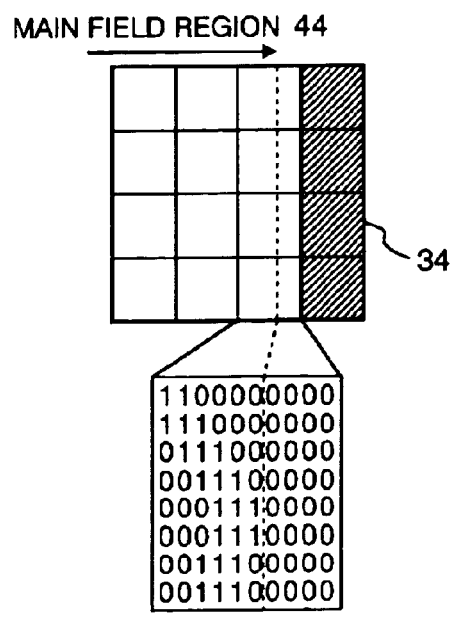
FIG. 12 is an explanatory diagram representing how to invalidate the sub-field region lying off the longitudinal width of the main field set at random.

FIG. 12 is an example of the embodiment where the lateral width of the main field is made variable. The sub-field lying off the lateral width of the main field is removed from the scope of exposure. For the sub-field that partly enters the main field, the exposure pattern data in the range lying outside lying off the lateral width of the main field is forcefully set to zero.

Here the longitudinal width of the main field corresponds to only one sub-field at most. So it does not happen that one sub-field lies fully off the longitudinal width. However, the lateral length corresponds to multiple sub-fields (four to ten sub-fields), so a sub-field is fully off the lateral width. In this case, means are provided in such a way that the relevant sub-field is removed from the scope of exposure, and writing operation is not performed. If the sub-field is removed from the scope of exposure, exposure time can be reduced by the amount corresponding to the removed sub-field. If the width of the stripe is almost uniform over the entire semiconductor wafer, continuous traveling exposure is enabled at a uniform speed over the entire surface, whereby writing accuracy is improved.

Figure 1:
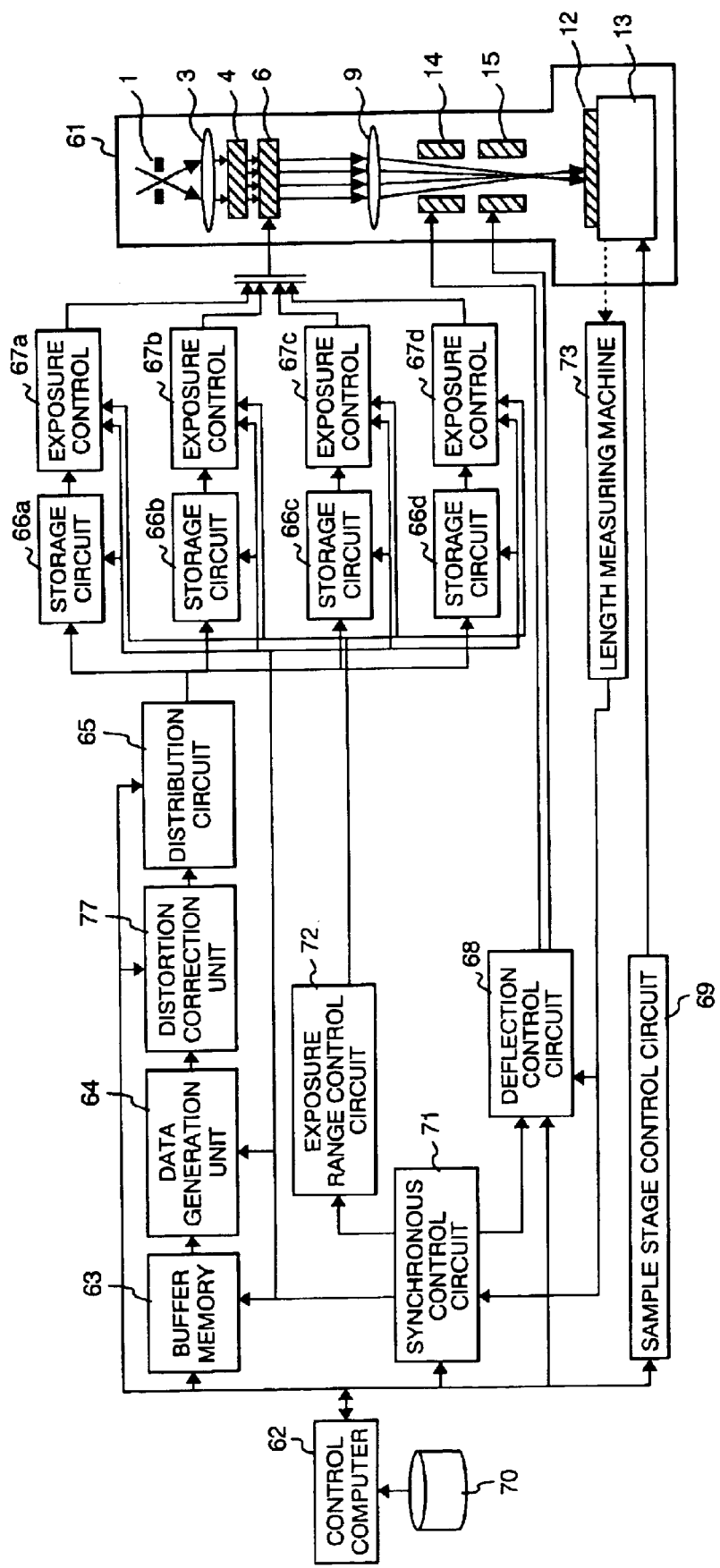
FIG. 1 is a block diagram representing a multi-electron beam exposure apparatus as one embodiment according to the present invention.

FIG. 1 is an overall configuration drawing of an electron beam exposure apparatus. An electron beam column 61 is provided on the right side of the drawing, and a data processor is located on the left. The compressed exposure data is read in advance from the file apparatus 70 of the control computer 62, and is stored in the buffer memory 63(data storage drive).

The surface of a sample is partitioned into stripe regions of small main field width, and writing is performed for each partitioned stripe. Stripe data is read from a buffer memory as required and is expanded into the bit map data by the data generation circuit 64.

The expanded data is then adjusted in such a way as to the distortion of the electron beam deflector is corrected by a distortion correction unit 77, and is stored into storage circuits 66a, 66b, etc. for each electron beam by a distribution circuit 65. In this case, the distribution circuit 65 adds "0" to the transferred data so that data "0" is written in the gap area having occurred to the sub-field data region of the storage circuit, depending on the dimension of the main field.

At the time of writing, the stored bit map data is read out in parallel by the exposure control circuits 67a, 67b, etc. and electron beam ON signal in conformity to the contrast value is applied to a blanking deflecting plate group 6. This arrangement allows the main field of desired dimensions to be specified even if the dimensions of the sub-field are fixed.

A stage control unit 69 moves a sample stage 12 carrying a sample 12. A length measuring machine 73 is a laser based length measuring machine that provides a high-precision measurement of the position of the sample stage at all times. Further, a synchronous control circuit 71 issues signals for synchronizing exposure data with electron beam deflection. A deflection control circuit 68 issues deflection signals of the main and sub-deflectors synchronously with the sync signal from the synchronous control circuit 71.

An exposure control circuit 72 is a circuit for another embodiment means when the width of the main field is made variable. As described above, instead of adding "0" in the gap area of the storage circuits 66a, 66b, etc., control signals are issued to ensure the electron beam ON signal will not be issued at times intervals when the gap region is written by each electron beam.

The following describes the operations during stripe exposure: The control computer 62 issues starting signals and sends them to the synchronous control circuit 71 and the stage control unit 69. The sample stage 13 starts to move through a predetermined stripe position at a uniform speed. The synchronous control circuit 71 monitors signals coming from the length measuring machine 7. When the predetermined position has been reached, exposure data is sent to the deflection control circuit 68 and all data processing circuits.

In the first place, a predetermined exposure data is read out of a buffer memory 63, and is expanded into the bit map data by the data generation circuit 64. Bit map data is sent to storage circuits 66a, 66b, 66c and 66d for individual electron beams by the distribution circuit 65. The stored bit map data is read out by the exposure control units 67a, 67b, 67c and 67d at the time of exposure to control the blanking deflector 6 of the corresponding electron beam. The deflection control circuit 68 determines the amount of main and sub-deflection based on the exposure position set by the control computer 62 in advance and the ever-changing sample stage position the information of which is output from the length measuring machine. The main deflector 14 and sub-deflector 15 are each controlled thereby.

The exposure range control circuit 72 provides control in such a way that the portion off the edge will be masked to prevent exposure to electron beam when the main field is set to a narrow dimension, thereby ensuring that incorrect exposure will not be performed. In the embodiment of the present invention, it is also possible to arrange such a configuration that the bit map data stored in the storage circuits 66a, 66b, etc. in advance is set to "0" so as to mask the region that is not subjected to exposure, as described above.

The operation of exposure by reading out the bit map data from the storage circuits 66a, 66b, 66c and 66d is performed repeatedly for each chip. Before the termination of exposure of all chips on one stripe, the bit map data of the next stripe is generated, and stored in the storage circuits 66a, 66b, 66c and 66d. This procedure allows the processing speed of the data generation circuit to be reduced below the exposure speed of the exposure control circuit, thereby downsizing the circuit.

FIG. 13 shows the writing procedure represented in the form of a flow chart. The (a) shows the procedure where data required for writing is prepared in units of stripe, and (b) indicates the procedure for writing in units of stripe using the data. In actual operation, while the stripe is exposed according to the procedure (b), the next data is prepared according to the procedure (a). This arrangement allows uninterrupted writing to be carried out if data preparation time is shorter than the exposure time. The following describes the details of procedures (a) and (b):

In the procedure for exposure data preparation, information on the dimensions of the chip on the wafer and the layout thereof is entered (Step s101). Then the first exposure stripe is determined (Step s102) based on this data. The position and dimensions of the main field therein and the sample stage speed during writing operation are calculated (Step s103). The information on the stripe position and the result of calculation are stored in the main storage circuit of the control computer 62 so that they can be used for writing.

After the position and dimensions of the main field have been determined, the bit map data is generated (Step s104) while the exposure data for exposure stripe is read from the buffer memory. In this case, "0" is inserted in the bit map data to correct the effective dimensions of the main field (Step s106). In the final phase, the corrected bit map data is stored in the storage memory of each electron beam (Step s107). The process of preparing data on one exposure stripe is now complete. This data preparation procedure is carried out for all stripes while monitoring the progress of the stripe exposure.

In the step of stripe exposure, the traveling of the sample stage starts according to the position of the exposure stripe stored in the main storage and writing speed (Step s201). This is followed by the step of monitoring to check if the position of the sample stage has reached the leading position of the exposure chip or not (Step s202). If it has reached the leading position, exposure of the main field in the chip is repeated according to the information on the position and dimensions of the main field (Step s203). Upon completion of the exposure of the main field in the chip (Step s204), the exposure of the next chip is repeated (Step s205), thereby completing exposure of all chips in the stripes.

As described above, the control computer 62 performs steps 101 through 107 during exposure of the stripe on the one hand. On the other hand, it transfers the bit map data to the other buffer of the double buffer memory unit of the storage circuit 66. In this manner, the Y-axis direction of the LSI chip is exposed according to the width of the main field sequentially, and exposure is performed repeatedly for each beam within one range in the Y-axis direction using the same pattern data.

Figure 14:
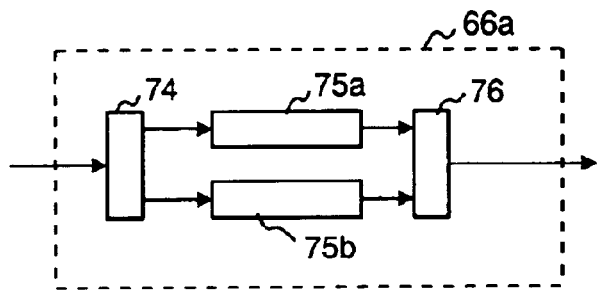
FIG. 14 is a block diagram representing the storage circuit using a double buffer memory unit.

FIG. 14 is a block diagram representing the details of the storage circuit. The storage circuit 66 (66a in this case) is composed of a double buffer memory unit (75a and 75b) holding the data in the stripe region of the LSI chip in the amount equivalent to two stripes. During repeated reading and exposure of one stripe data item by means of a distribution circuit 74 and a selection circuit 76, the data of the next stripe is entered and stored.

This arrangement allows the next stripe data to be written while the same data is repeatedly read out ten to several hundreds of times. This means a substantial speed reduction as compared to the case of real-time data generation; hence a substantial reduction in the cost of manufacturing the data generation circuit. This arrangement ensures that the same spot on each LSI chip is always exposed to the same electron beam, and therefore eliminates the need of keeping multiple sets of the bit map data to be stored, with the result that the storage capacity as a whole is minimized.

Figure 15:
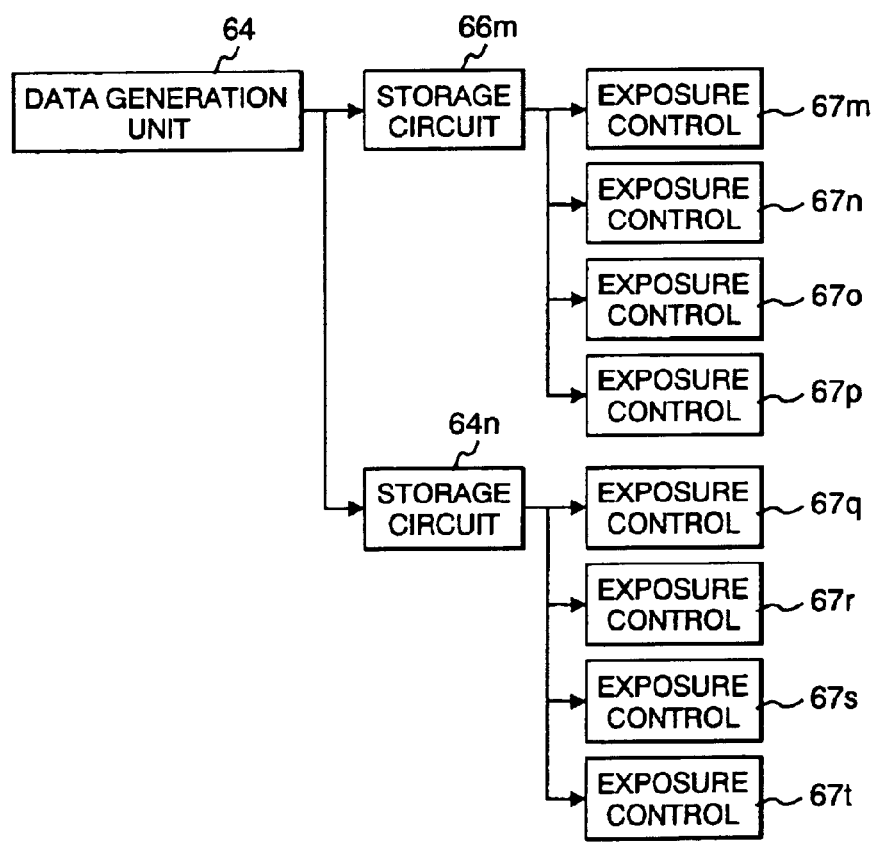
FIG. 15 is a block diagram representing another embodiment ranging from a data generation circuit to an exposure control circuit.

FIG. 15 is a block diagram representing another embodiment. If there is sufficient margin in the storage capacity of the storage circuits 66a, 66b, etc. and reading speed, electron beam is divided into groups, as illustrated, and one storage circuit 66m or 66n is assigned to each group. Exposure control units 67m, 67n, . . . and 67t of respective beams read data from the storage circuit of the pertinent group. Since the storage capacity of the recent semiconductor memory has been increased drastically, this arrangement further reduces the size of the circuits in the entire storage apparatus.

The present invention allows the exposure control circuit of each electron beam to be used to write the once prepared pattern data ten to several hundreds of times repeatedly. Accordingly, there is no problem if a long time is required before the next pattern data is prepared. The size of the circuit in the extra-high speed pattern expanding unit for preparing the pattern data can be reduced to one tenth through a few hundredths. Since the circuit size of an extra-high speed pattern expanding unit of the prior art multi-electron beam exposure apparatus is very large, the cost reduction achieved by the present invention provides a drastic effect.

The present invention eliminates the need of multiple sets of the pattern data being stored by the exposure control circuit of each electron beam. Accordingly, the pattern data to be stored simultaneously is limited only to the stripe being exposed and the next stripe to be exposed. This allows the storage capacity to be reduced to about one tenths. Since the amount of pattern data in the LSI circuit pattern is extremely great, the cost reduction achieved by the present invention provides a drastic effect.

Each reference sign shows the following patrs:

1 . . . Electron gun, 2 . . . Electron beam, 3 . . . Electron lens 4 . . . Aperture, 5a, 5b, 5c, 5d . . . Electron beam, 6a, 6b, 6c, 6d . . . Blanking deflecting plate, 7 . . . Electron lens, 8 . . . Blanking aperture, 9, 10, 11 . . . Electron lens, 12 . . . Sample, 13 . . . Sample stage, 14 . . . Main deflecting plate, 15 . . . Sub-deflecting plate, 15Xa, 15Xb . . . X-axis sub-deflecting plate, 15Ya, 15Yb . . . Y-axis sub-deflecting plate, 21 . . . Sub-field, 22a, 22b, 22c, 22d . . . Electron beam, 14Xa, 14Xb X-axis . . . main deflecting plate, 23 . . . Stripe region, 24a, 24b, 24c, 24h . . . Sub-field, 33 . . . Main field, 31 . . . Exposure region, 32a, 32b . . . Stripe region, 34 . . . Sub-field, 35a, 35b, 35c, 35d . . . Electron beam, 36 . . . μ field, 41 . . . Semiconductor wafer, 42 . . . LSI chip, 43 . . . Stripe region, 42a, 42b . . . LSI chip, 44 . . . Main field, 45a, 45b, 45m, 45nμ field, 45a', 45b', 45m', 45n' μ field, 4 . . . μ field, 52 . . . Stripe boundary, 53 LSI chip, 51a, 51b, 51m, 51n . . . μ field, 51a', 51b', 51m', 51n' μ field, 61 . . . Electron beam column, 62 . . . Control computer, 63 . . . Buffer memory, 64 . . . Data generation circuit, 65 . . . Distribution circuit, 66a, 66b, 66c, 66d, 66m, 66n . . . Storage circuit, 67a, 67b, 67c, 67d, 67m, 67n, 67t . . . Exposure control circuit, 68 . . . Deflection control circuit, 69 . . . Sample stage control circuit, 70 . . . File apparatus, 71 . . . Synchronous control circuit, 72 . . . Exposure control circuit, 73 . . . Laser length measuring machine, 74 . . . Distribution circuit, 75a, 75b . . . Buffer memory, 76 . . . Selection circuit.

The present invention permits correction of the pattern data to be performed in the phase of preparing the pattern data. The pattern data generation and storage speed may be kept at one tenth through one hundredth the speed for reading and writing the data. So the size of the circuit can be reduced to one tenth through one hundredth that in the case where pattern data is corrected. Thus, the cost reduction achieved by the present invention provides a drastic effect.

What is claimed is:

1. A multi-electron beam exposure method, wherein multiple electron beams are applied to a sample surface mounted on a traveling sample stage to perform repeated exposure of chip patterns wherein the method comprises the steps of:
   in a case that the sample surface is represented in an X-Y coordinate system, a continuous traveling direction of a sample stage is assumed as a Y-axis direction, and the sample surface has a plurality of chips of the same kind located in a line at equal intervals respectively in the X and Y directions which are exposed;
   partitioning an exposure region of the sample surface into multiple stripe regions having a width in the X-axis direction;
   further partitioning each of the multiple stripe regions into multiple main fields having a width in the Y-axis direction;
   setting at least one of the widths of the main fields in the X- and Y-axis directions to an integral submultiple of the chip size;
   storing exposure pattern data for one chip based on the partitioned main fields as a unit; and
   reading out the stored exposure pattern data a number of times corresponding to the number of the chips repeatedly;
   wherein each electron beam provides repeated exposure of same regions of the chips.

2. A multi-electron beam exposure method according to claim 1, wherein the Y-axis direction is partitioned in conformity to chip width, and a stripe subregion is repeatedly exposed according to the partitioned bit map data.

3. A multi-electron beam exposure method according to claim 1, wherein while one of the stripe regions is exposed, the bit map data of a next stripe region is generated and saved.

4. A multi-electron beam exposure method according to claim 1, wherein the width of said main fields in the X-axis direction is set to an integral submultiple of the chip size in the X-axis direction; and
   each electron beam provides repeated exposure of some regions of said chips in the X-axis direction.

5. A multi-electron beam exposure method according to claim 1, wherein the width of said main fields in the Y-axis direction is set to an integral submultiple of the chip size in the Y-axis direction; and
   each electron beam provides repeated exposure of the same regions of said chips in the Y-axis direction.

6. A multi-electron beam exposure apparatus comprising:
   a deflector for deflecting multiple electron beams as one integral one and blanking means far providing independent control of application of said electron beams to a sample;
   a pattern generation unit for expanding compressed pattern data and generating bit map data;
   a storage unit for storing the generated bit map data in a form associated with said electron beams; and
   an exposure control unit for controlling said blanking mean based on the stored bit map data;
   wherein the storage unit consists of a double buffer memory unit that stores the bit map data in a next exposure unit region generated by the pattern generation unit, while the bit map data in the stored exposure unit region is repeatedly read out by the exposure control unit;
   in a case that the sample surface is represented in an X-Y coordinate system, a continuous traveling direction of a sample stage is assumed as a Y- axis direction, and the sample surface has a plurality of chips of the same kind located in a line at equal intervals respectively in the X and Y directions which are exposed;
   an exposure region of the sample surface is partitioned into multiple stripe regions having a width in the X-axis direction;
   each of the multiple stripe regions is further partitioned into multiple main fields having a width in the Y-axis direction;
   at least one of the widths of the main fields in the X- and Y-axis directions is set to an integral submultiple of the chip size;
   exposure pattern data for one chip are stored based on the partitioned main fields as a unit;
   the stored exposure pattern data are readout a number of times corresponding to the number of the chips repeatedly; and
   each electron beam provides repeated exposure of the same regions of said chips.

7. A multi-electron beam exposure apparatus according to claim 6, wherein the bit map data of the exposure unit is the bit map data in the chip stripe regions obtained by partitioning a repeatedly exposed pattern by a width in a main deflector.

8. A multi-electron beam exposure apparatus according to claim 7, wherein the generation unit for generating said bit map data contains a correction unit for correcting distortion of a second deflector for deflecting electron beams.

9. A multi-electron beam exposure apparatus according to claim 6, wherein the pattern generation unit for generating the bit map data contains a correction unit for correcting distortion of the second means for deflecting electron beams.

* * * * *